United States Patent

Sua et al.

[11] Patent Number: 5,663,105
[45] Date of Patent: Sep. 2, 1997

[54] SEMICONDUCTOR DEVICE PACKAGE SIDE-BY-SIDE STACKING AND MOUNTING SYSTEM

[75] Inventors: Goh Jing Sua; Chan Min Yu, both of Singapore, Singapore

[73] Assignee: Texas Instruments Incorporated, Dallas, Tex.

[21] Appl. No.: 586,366

[22] Filed: Jan. 16, 1996

Related U.S. Application Data

[62] Division of Ser. No. 485,227, Jun. 7, 1995, abandoned, which is a continuation of Ser. No. 236,768, May 2, 1994, Pat. No. 5,619,067.

[51] Int. Cl.$^6$ ........................................... H01L 21/60
[52] U.S. Cl. ........................ 438/109; 438/117; 29/832
[58] Field of Search ................................. 257/704, 723, 257/724, 731, 732; 361/729, 730, 735, 744, 807, 809; 437/51, 208, 915, 209, 211, 214, 215, 217, 219

[56] References Cited

U.S. PATENT DOCUMENTS

| | | | |
|---|---|---|---|
| Re. 34,794 | 11/1994 | Farnworth | 257/733 |
| 4,706,166 | 11/1987 | Go | 257/676 |
| 4,967,262 | 10/1990 | Farnsworth | 257/670 |
| 5,109,317 | 4/1992 | Miyamoto et al. | 361/386 |
| 5,413,970 | 5/1995 | Russell | 437/208 |

FOREIGN PATENT DOCUMENTS

| | | | |
|---|---|---|---|
| 0248451 | 11/1986 | Japan | 257/704 |
| 0274479 | 11/1989 | Japan | 257/731 |
| 0132250 | 5/1992 | Japan | 257/731 |

*Primary Examiner*—Kevin Picardat
*Attorney, Agent, or Firm*—Warren L. Franz; Wade James Brady, III; Richard L. Donaldson

[57] ABSTRACT

The invention is to an array of stacked devices utilizing vertical surface mounted semiconductor devices stacked side by side and inserting the stack of devices into a casing. The packaged stack of devices creates a cube package which is capable of replacing SIMM boards, and saves considerable space. The casing dissipates heat generated in the devices, and may be of metal or thermally conductive plastic.

15 Claims, 4 Drawing Sheets

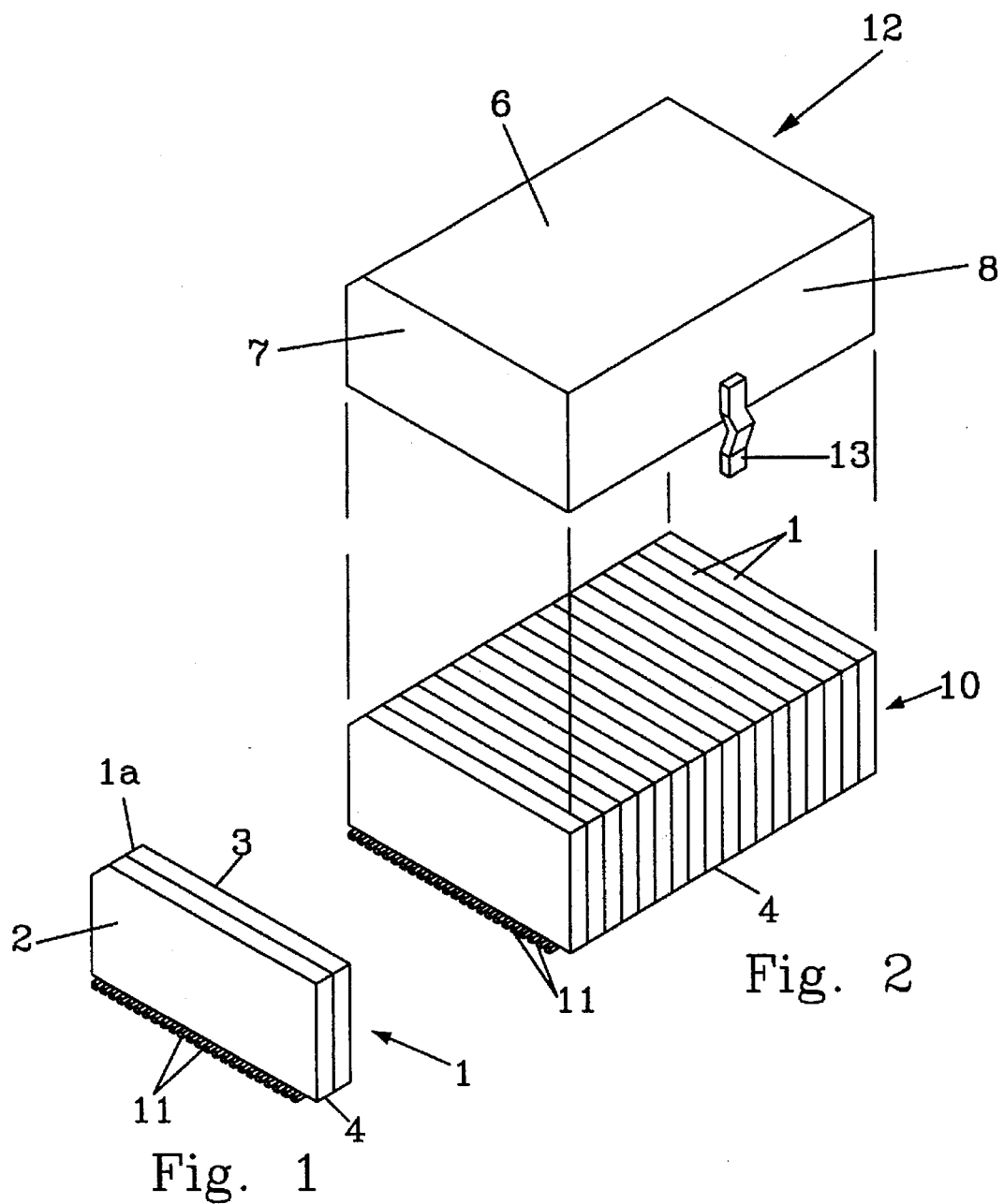

SEMICONDUCTOR DEVICE PACKAGE SIDE-BY-SIDE STACKING AND MOUNTING SYSTEM

This application is a division of application Ser. No. 08/485,277, filed Jun. 7, 1995, now abandoned; which is a continuation of application Ser. No. 08/236,768, filed May 2, 1994, now U.S. Pat. No. 5,619,067.

FIELD OF THE INVENTION

This invention relates to semiconductor devices, and more particularly to a mounting the stacked packages onto a circuit board.

BACKGROUND OF THE INVENTION

Memory devices used, particularly in computers, are arrayed on the computer circuit board, or mounted on small circuit boar& to group encapsulated memory device packages into a distinct amount of memory capacity. For example, SIMM (Semiconductor Integrated Memory Module) devices, utilize several memory device packages interconnected on a small circuit board to form memory modules. The devices comprise integrated circuit memory chips encapsulated into discrete protective packages, with electrical connections established by soldering exposed chip contact leads onto corresponding contacts of the circuit board. The sockets into which the memory circuit boards are mounted on the computer circuit board occupy considerable space, especially if the computer is to be designed to utilize 4-Mbytes or more of memory. As computer boards become more complex, and additional functions are integrated into fie computer circuit board, the space required for individual memory devices and SIMM modules needs to be reduced to accommodate other circuitry.

SUMMARY OF THE INVENTION

The invention is to an array of stacked devices utilizing vertical surface mounted semiconductor devices stacked side by side and inserting the stack of devices into a casing. The packaged stack of devices creates a cube package which is capable of replacing SIMM boards, and saves considerable space. The casing dissipates heat generated in the devices, and may be of metal or thermally conductive plastic.

The casing has two side clips which clip directly onto the circuit board on which the devices are to be mounted. The devices, which normally are attached to a circuit board by solder reflow, may be tightly damped to contact pads on the circuit board, avoiding the necessity to solder the devices to the circuit board, and allowing the devices to be removed, when defective, without the need to remove a solder connection. Larger memory arrays are possible in a smaller space by stacking or joining a number of arrays together.

The technical advance represented by the invention as well as the objects thereof will become apparent from the following description of a preferred embodiment of the invention when considered in conjunction with the accompanying drawings, and the novel features set forth in the appended claims.

BRIEF DESCRIPTION OF THE DRAWINGS

FIG. 1 illustrates a single vertical surface mount semiconductor device;

FIG. 2 shows an array of several vertical surface mount devices, and a casing for enclosing the devices;

DESCRIPTION OF PREFERRED EMBODIMENT

Figure 3:
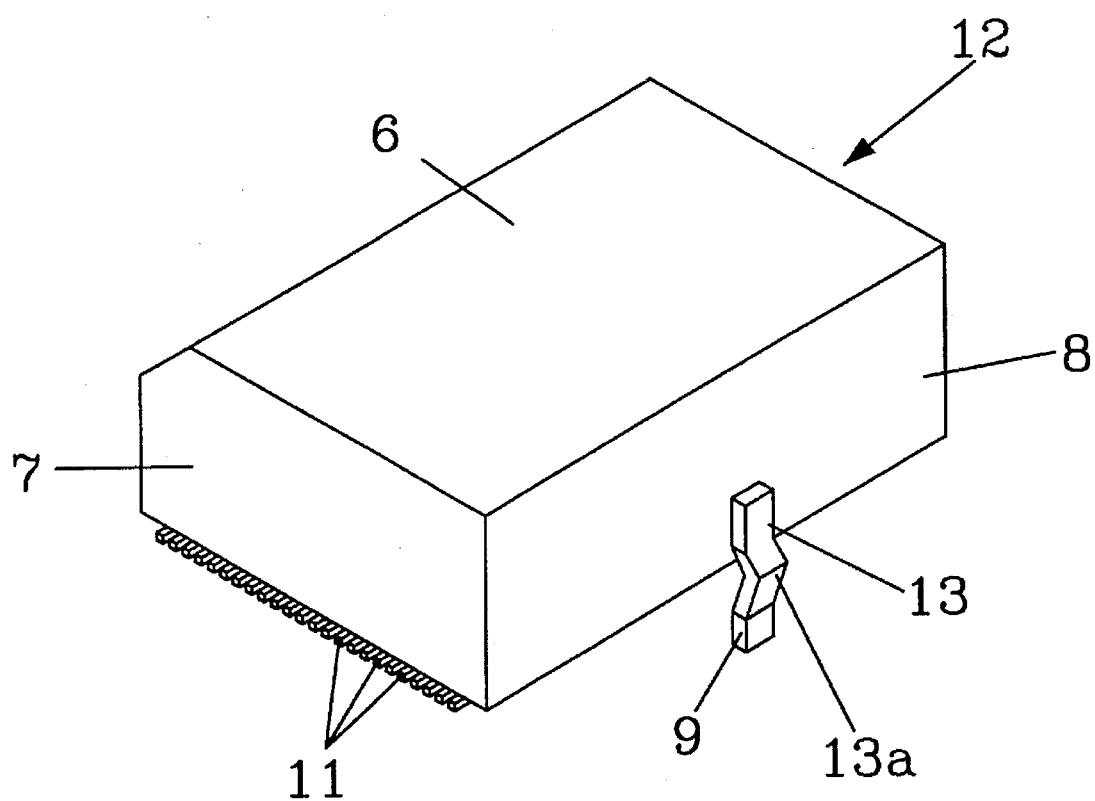
FIG. 3 shows the encased devices.

FIG. 1 shows a vertical surface mount device 1 which comprises an encapsulated integrated circuit memory chip having generally planar and parallel, rectangular front and rear side faces 2, 3 and a plurality of contacts 11 extending out from a bottom edge 4 of the packaged device. Device 1 is usually flow soldered onto a circuit board having a contact pad for each contact 11.

FIG. 2 shows an array 10 of nine identical vertical surface mount devices stacked horizontally together, side by side with their side faces 2, 3 brought into adjacent superposed relationships so that a front face 2 of one device 1 abuts a rear face 3 of a neighboring device 1 and so that their bottom edges 4 are aligned in a common plane with the contacts 11 of each device packages extending out of the bottom of stack 10 of the arrayed devices. More or fewer device packages may be encased, depending upon the particular application. A case 12 is shown positioned above the horizontally arrayed device packages. Case 12 is placed over devices 1 and encloses them as illustrated in FIG. 3. As shown, case 12 has a generally rectangular bottom parallelepiped box-like construction, with a bottom opening internal cavity 5 (see FIG. 4) defined by internal surfaces of top, front and rear end, and right and left side walls 6, 7, 8. The dimensions of cavity 5 are chosen so that the open bottom of case 12 can be placed over the array 10, to bring the top, ends and sides of array 10 into corresponding abutment with top, end and side surfaces 6, 7, 8 of cavity 5, leaving contacts 11 exposed and accessible through the open bottom of case 12. There are two clips 13, only one shown in FIG. 3, located in spaced positions, attached to respective opposite sides 8 of case 12. The clips 14 have depending leading ends 9 which are inserted respectively into correspondingly spaced holes in a circuit board, described below, to hold the case and arrayed device packages in contact with contact pads on a circuit board. The clips are made, for example from a spring-leaf material, and have a V-noah 13a for securing the clips by snap action within the holes in the circuit board.

Figure 4:
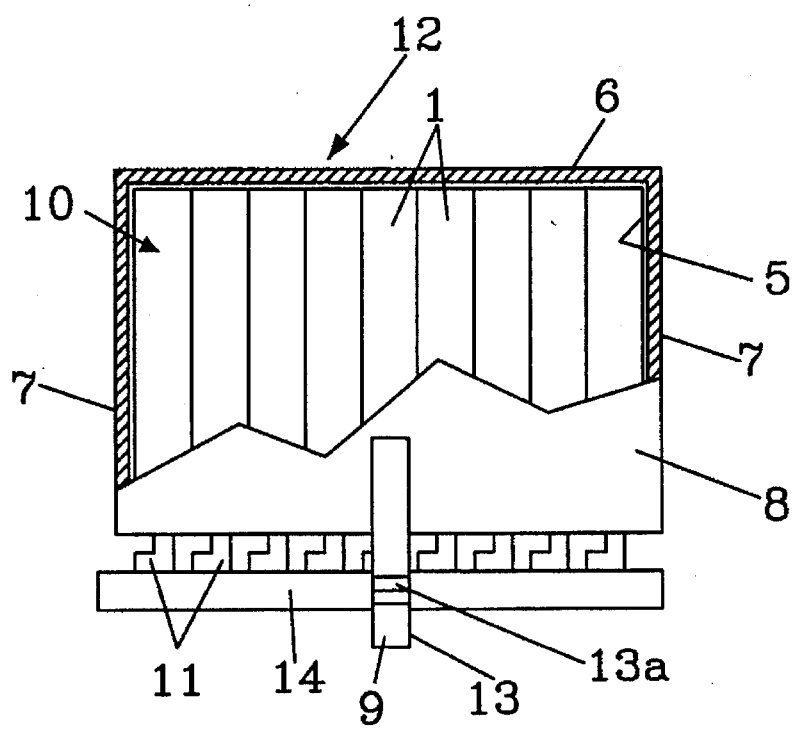
FIG. 4 shows encased devices on a circuit board with a side cut-away showing the devices.

FIG. 4 shows an end view of the arrayed packaged deuces 1 in a case 12, with a potion of the case cut away to show the packaged devices in case 12. Contact 11, which extend below the bottom of case 11, are in contact with circuit board 14. Clip 13 extends through a hole in circuit board 14.

Figure 5:
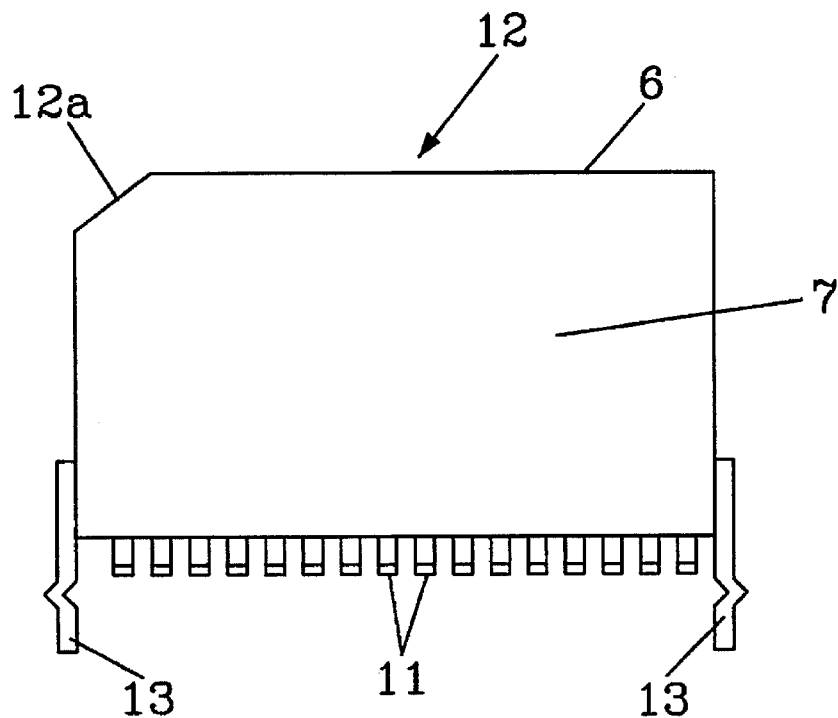
FIG. 5 is a side view of the cased devices.

FIG. 5 is a side view of the encased array 10 of packaged deuces 1. Case 12 conforms at an angled cut-off top corner edge 12a with a correspondingly angled top edge of the stacked array 10 defined by aligned chambered edges 1a of the package exteriors of deuces 1, as shown in FIG. 1. The conforming of an angled top corner of case 12 with the corresponding aligned angled chamfered edges of the package exteriors of devices 1 helps hold devices 1 in position within case 12 and present more surface area of each deuce package in contact with the case. This is important since case 12 also serves as a heat sink for the cased devices. Case 12 may be either metal or a thermally conductive plastic to assist in dissipating heat generated by the devices. Both clips 13 are shown in FIG. 5. The two clips securely hold case 12 over packaged devices 1 against a circuit board on which the packaged deuces are mounted.

Figure 6:
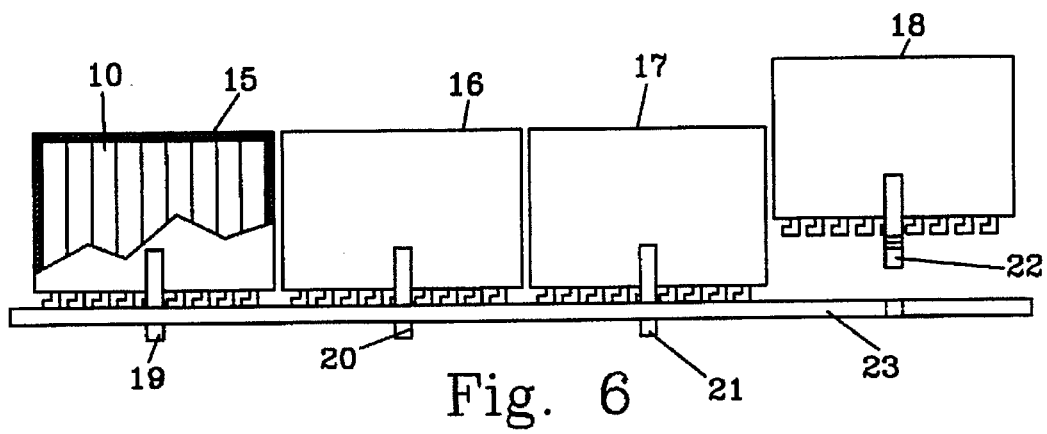
FIG. 6 shows four sets of cased devices on a circuit board.

FIG. 6 shows four sets of cased deuces. As an example, if deuces 1 are 1-Mbyte memory devices, each cased array 10 represents a 9×1-Mbyte array, providing 1 Mbyte of memory. Eight deuces are needed to provide a 1-Mbyte×8-bit memory. Eight devices in a case provide provide the 1-Mbyte×8-byte memory array. The ninth clip provides a ninth bit for parity. The four cased arrays 10 then provide 4 Mbytes of memory, which is commonly used in computer systems.

Figure 7:
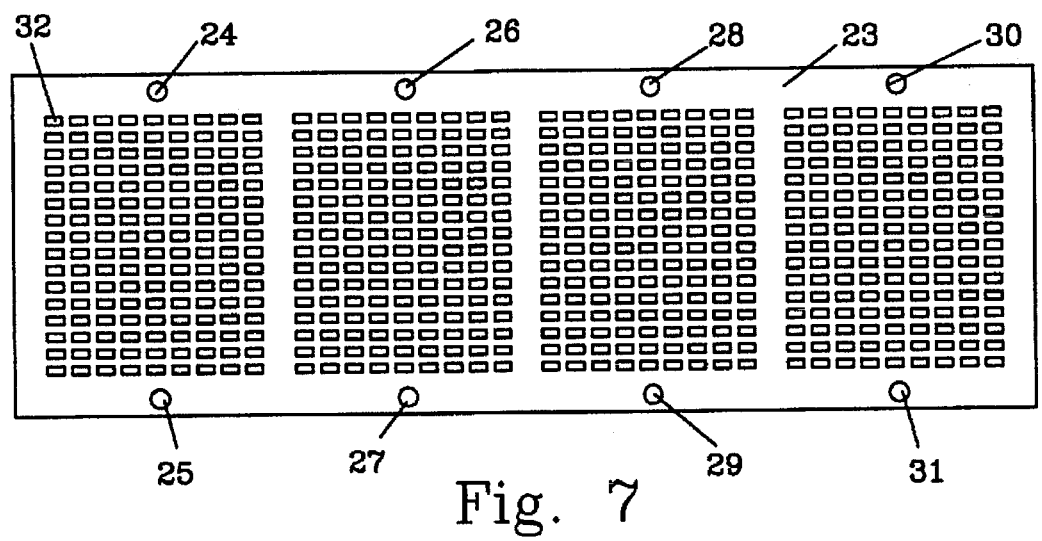
FIG. 7 shows the top Of the circuit board with the arrayed contact pads for mounting the devices.

FIG. 7 shows the top of a circuit board 23 with contacts 32 arrayed for the four cased arrays in FIG. 6. In the illustrated example, each packaged device has 16 pins. Therefore, to provide contacts to each pin on each chip, an array of 16×9 contacts is needed for each cased array. In practice, the mounting area required by the four cased arrays is less than the space required by four SIMM modules.

Circuit board 23 has four sets of holes 24–31, one set for each 16×9 array of Contacts. Clips 19–22 lock in holes 25–31 and another set of clips (not illustrated) lock into holes 24–30, to hold cased arrays 15–18 on circuit board 23. When the clips are locked into the holes on circuit board 23, sufficient down-pressure is exerted on the device packages to hold the device contacts in electrical contact with contact pads 32. Therefore, it is not necessary to flow solder the contacts on the devices to the contact pads on the circuit board.

What is claimed:

1. A method for stacking and mounting a plurality of packaged semiconductor devices on a circuit board, said method comprising:

stacking a plurality of encapsulated vertical surface mount semiconductor device packages side by side within an open bottom cavity of a casing; said devices packages being stacked vertically into a horizontal array, with front side faces of said packages brought into superposed relationships with rear side faces of adjacent packages, and with bottom edges aligned so that contact leads extending out from respective ones of said bottom edges protrude in a common plane out from said casing open bottom; and securing said casing to a circuit board to press said contact leads into solderless electrical connection with corresponding contact pads on said board.

2. The method of claim 1, wherein, in said stacking step, said semiconductor device packages are stacked into an array having a top, ends and sides, and said array is positioned within said cavity with said array top, ends and sides in abutment with internal surfaces of corresponding top, ends and sides of said casing.

3. The method of claim 2, wherein said semiconductor device packages have chamfered corners and said cavity has a matching angled edge; and wherein, in said stacking step, said semiconductor device packages are stacked to align said chamfered corners to form an angled edge in said array, and said array angled edge is positioned in abutting contact with said cavity matching angled edge.

4. The method of claim 3, wherein, in said securing step, said casing is secured to said circuit board by snapping a spring-leaf clip into a hole in said board.

5. A method for mounting multiple packaged semiconductor devices on a circuit board, said method comprising:

providing a plurality of encapsulated vertical surface mount semiconductor device packages, each package having an exterior with front and rear side faces and bottom edges with contact leads extending out from said bottom edges;

positioning said device packages vertically in a side-by-side array with said side faces in adjacent superposed relationships and said bottom edges aligned in a common plane;

enclosing said side-by-side array of semiconductor device packages in a casing, leaving said contact leads exposed; and securing said casing with said enclosed array onto a circuit board to press said exposed contact leads against said board for establishing solderless electrical connection between said leads and said board.

6. The method according to claim 5, wherein said array has an external contour; said casing is made from a heat conducting material and has an internal contour that conforms to said external contour of said array; and said array is enclosed with said internal contour in contact with said external contour.

7. The method according to claim 5, wherein, in said securing step, said casing is releasably secured onto said circuit board.

8. The method according to claim 7, wherein said securing step comprises releasably locking a clip made from a spring-leaf material into a hole on said circuit board.

9. The method according to claim 5, wherein said circuit board is provided with an array of contact pads thereon in positions corresponding to relative positioning of said leads of said semiconductor devices in said array; and said casing is secured to said circuit board, with said leads respectively pressed against said contact pads.

10. A method for mounting multiple packaged semiconductor devices on a circuit board, each device comprising an integrated circuit chip encapsulated into a discrete protective package and having contact leads extending out of an edge of said package, said method comprising:

positioning said device packages vertically in a side-by-side array;

enclosing said array of semiconductor devices in a casing, leaving said contact leads exposed; and releasably securing said casing and enclosed semiconductor devices to a circuit board, to press said leads into solderless electrical connection with respective contact pads on said board.

11. The method according to claim 10, wherein said casing is provided with an internal contour that conforms to an external contour of said array of semiconductor device packages; said casing is made from a heat conducting material; and said devices are enclosed within said casing with said internal contour in contact with said external contour.

12. The method according to claim 10, wherein said securing step comprises inserting clips on said casing into holes on said circuit board.

13. The method according to claim 12, wherein said securing step comprises releasably locking spring-leaf clips into said holes.

14. The method of claim 11, wherein said semiconductor device packages are provided with chamfered corners; said chamfered corners are aligned in said array to form an angled external edge; said casing internal contour is angled to define a corresponding angled internal edge; and said angled external edge is placed in abutment with said angled internal edge.

15. A method for stacking and mounting multiple packaged semiconductor devices on a circuit board, said method comprising:

providing a plurality of arrays of contact pads on said circuit board;

providing a plurality of casings, each casing having top, end and side walls with internal surfaces defining an internal cavity with an open bottom;

stacking a plurality of encapsulated semiconductor device packages associated with each casing; said packages each having front and rear side faces, a bottom edge, and contact leads extending from said bottom edge;

stacking the packages of each of said plurality of packages vertically in side-by-side relationships within the respective internal cavity of each associated casing, with said front and rear side faces in superposed relationships and said bottom edges aligned to present said contact leads of the respective packages of each casing in a generally planar array of contact leads exposed at said open bottom; and securing each casing to said circuit board; said securing serving to establish solderless electrical contact between leads of said contact lead arrays and respective pads of said contact pad arrays.

* * * * *